(12) United States Patent
Chen et al.

(10) Patent No.: US 10,574,196 B2
(45) Date of Patent: Feb. 25, 2020

(54) AMPLIFIER DEVICE

(71) Applicant: RichWave Technology Corp., Taipei (TW)

(72) Inventors: Chih-Sheng Chen, Taipei (TW); Ming-Shiuan Wen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/153,805

(22) Filed: Oct. 7, 2018

(65) Prior Publication Data

US 2019/0356283 A1 Nov. 21, 2019

(30) Foreign Application Priority Data

May 18, 2018 (TW) .............................. 107116891 A

(51) Int. Cl.
| | | |
|---|---|---|
| *H03F 3/191* | (2006.01) | |
| *H03F 3/19* | (2006.01) | |
| *H03H 7/38* | (2006.01) | |
| *H03F 1/56* | (2006.01) | |
| *H03F 3/21* | (2006.01) | |
| *H03F 3/24* | (2006.01) | |
| *H04B 1/04* | (2006.01) | |

(52) U.S. Cl.
CPC .............. *H03F 3/19* (2013.01); *H03F 1/565* (2013.01); *H03F 3/21* (2013.01); *H03F 3/245* (2013.01); *H03H 7/38* (2013.01); *H03F 2200/225* (2013.01); *H03F 2200/451* (2013.01); *H04B 2001/0408* (2013.01)

(58) Field of Classification Search
CPC ...................................................... H03F 3/191
USPC .................................................. 330/302, 310
See application file for complete search history.

(56) References Cited

U.S. PATENT DOCUMENTS

| | | | |
|---|---|---|---|
| 6,215,359 B1 * | 4/2001 | Peckham | .................. H03F 1/56 330/145 |
| 8,149,050 B2 * | 4/2012 | Cabanillas | ............ H03F 1/0277 330/302 |
| 2002/0039047 A1 * | 4/2002 | Suzuki | .................. H03F 1/3205 330/133 |

(Continued)

FOREIGN PATENT DOCUMENTS

| | | |
|---|---|---|
| CN | 1149748 C | 5/2004 |
| CN | 101297479 B | 8/2011 |

(Continued)

*Primary Examiner* — Henry Choe
(74) *Attorney, Agent, or Firm* — Winston Hsu

(57) ABSTRACT

A power amplifier device includes a first amplifier, a second amplifier, a capacitor, a node, and an impedance matching circuit. The second amplifier amplifies a radio frequency signal transmitted from the first amplifier. The capacitor is coupled between an output terminal of the first amplifier and an input terminal of the second amplifier. The node is disposed between the input terminal of the second amplifier and the capacitor. The impedance matching circuit is coupled to the node and a common voltage terminal. The impedance matching circuit is substantially an open circuit at a center frequency of the radio frequency signal. The impedance matching circuit provides substantially a short-circuited path from the node to the common voltage terminal at a frequency twice the center frequency.

20 Claims, 2 Drawing Sheets

(56) References Cited

U.S. PATENT DOCUMENTS

2009/0189696 A1\* 7/2009 Deng .................... H03F 1/0205
 330/302
2010/0194491 A1 8/2010 Fukuda

FOREIGN PATENT DOCUMENTS

CN 107231134 A 10/2017
TW 200612656 4/2006

\* cited by examiner

AMPLIFIER DEVICE

CROSS REFERENCE TO RELATED APPLICATION

This application claims priority of Taiwan application No. 107116891, which was filed on May 18, 2018, and is included herein by reference.

TECHNICAL FIELD

The present invention is related to an amplifier device, and more particularly, to a power amplifier device capable of preserving linearity performance in high power mode.

BACKGROUND

With the popularity of networks and mobile devices, people have a growing demand for wireless communications, and the radio frequency (RF) power amplifier is a key component in wireless communications. The RF power amplifier can amplify signals at specific frequencies, allowing steady RF signals to be received to deliver information, implementing wireless communications. In order to adapt to different environments, the RF amplifier usually requires great energy to amplify the RF signals to the required intensity. However, during the high-power amplification, the RF amplifier will lose linearity of amplification, resulting in signal distortion.

In addition, since the RF amplifier is usually disposed at the last stage of the signal transmitter, the linearity of the RF amplifier will affect the quality of wireless communications directly. An important factor that causes the linearity loss of the RF amplifier is the third-order intercept and intermodulation (IM3). The third-order intercept and intermodulation is generated at the output terminal of the RF amplifier after two or more input signals of similar frequencies being amplified by the RF amplifier nonlinearly. Since the frequency of the third order intercept and intermodulation is the closest to the frequency of the input signals, it is very difficult to filter out the third-order intercept and intermodulation by the filter.

SUMMARY

One embodiment of the present invention discloses an amplifier device. The amplifier device includes a first amplifier, a second amplifier, a capacitor, a node, and an impedance matching circuit.

The first amplifier amplifies a radio frequency signal. The second amplifier receives the radio frequency signal transmitted from the first amplifier, and amplifies the radio frequency signal. The capacitor is coupled to an output terminal of the first amplifier and an input terminal of the second amplifier. The node is disposed between the input terminal of the second amplifier and first capacitor. The first impedance matching circuit is coupled to the node and a common voltage terminal. The first impedance matching circuit behaves as a substantially open circuit at a center frequency of the radio frequency signal, and the impedance matching circuit provides a substantially short-circuited path from the node to the common voltage terminal at a frequency twice the center frequency.

DETAILED DESCRIPTION

Figure 1:
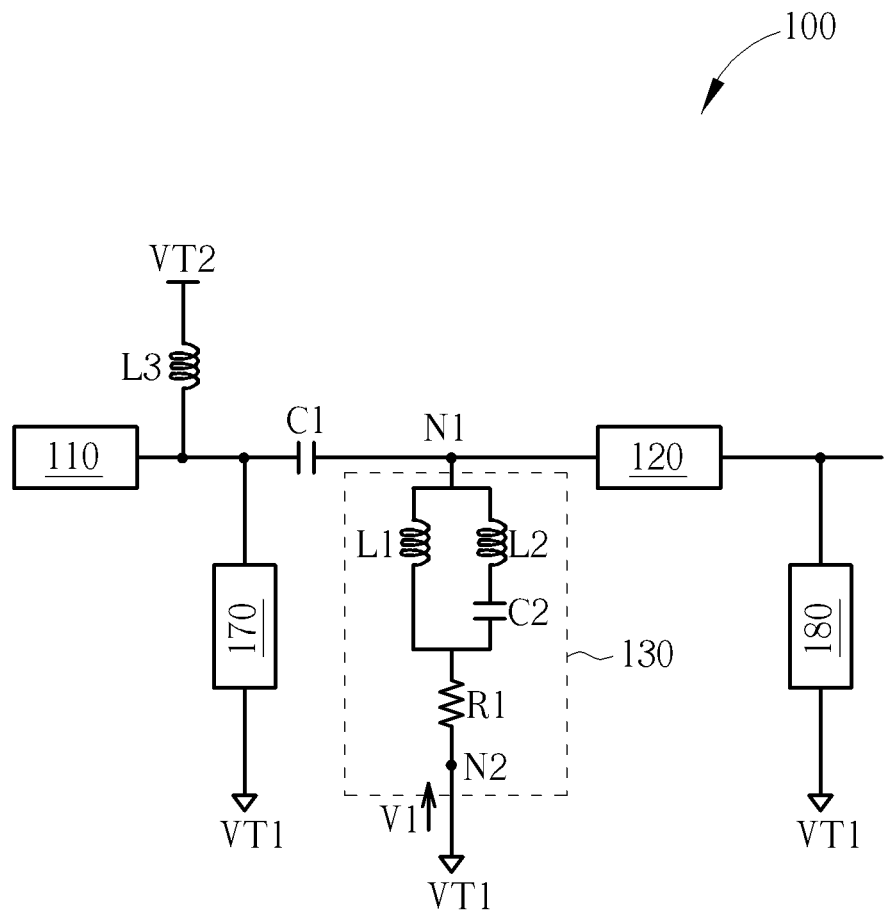
FIG. 1 shows an amplifier device according to one embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows an amplifier device, such as a power amplifier device 100 according to one embodiment of the present invention. The power amplifier device 100 includes amplifiers 110 and 120, a capacitor C1, and a first impedance matching circuit 130.

The amplifier 110 can amplify radio frequency (RF) signals, and the amplifier 120 can receive the RF signals transmitted from the amplifier 110. That is, the amplifier 110 and the amplifier 120 are two succeeding stages of amplifiers, and can amplify the RF signals stage by stage. In some embodiments of the present invention, the power amplifier device can include more stages of amplifiers according to the required signal intensity.

In addition, the power amplifier device 100 can have the capacitor C1 coupled between the output terminal of the amplifier 110 and the input terminal of the amplifier 120 to block the DC signal on the transmission path. The first impedance matching circuit 130 can be coupled between the node N1 and the common voltage terminal VT1, and the node N1 can be disposed between the input terminal of the amplifier 120 and the capacitor C1. In some embodiments, the common voltage terminal VT1 can provide the first system voltage V1. The first system voltage V1 can be, for example, the ground voltage or the system reference voltage.

In the present embodiment, the power amplifier device 100 can mainly amplify the RF signals at frequencies close to a center frequency and additionally generate the IM3 of the RF signals because of the nonlinearly of the RF amplifier. Since the IM3 of the RF signals with frequencies close to the center frequency will also have frequencies close to the center frequency, the IM3 of the RF signals is difficult to be filtered out. Also, since the IM3 of the RF signals is mainly caused by the second order harmonic of the RF signals, the first impedance matching circuit 130 can provide a substantially short-circuited path from the node N1 to the common voltage terminal VT1 at the frequency twice the center frequency so the second order harmonic of the RF signals will be lead to the short-circuited path, decreasing the intensity of the IM3 of the RF signals. Consequently, the linearity of the outputted RF signals can be increased, ensuring the wireless communications quality.

In addition, the first impedance matching circuit 130 can behave as a substantial open circuit at the center frequency of the RF signals to ensure that the RF signals can be inputted to the amplifier 120 smoothly. Since the first impedance matching circuit 130 can provide a substantial short-circuited path for the second harmonic of the RF signals before the RF signals enters the amplifier 120, the IM3 of the RF signals can be reduced effectively.

In FIG. 1, the first impedance matching circuit 130 includes an inductor L1, a capacitor C2, and an inductor L2. The inductor L1 is coupled between the node N1 and the node N2, and the first impedance matching circuit 130 can be coupled to the common voltage terminal VT1 through the node N2. The inductor L2 and the capacitor C2 are coupled in series between the node N1 and the node N2. That is, the capacitor C2 and the inductor L2 are coupled in series and are coupled in parallel with the inductor L1. By choosing the proper capacitance and inductance, the first impedance matching circuit 130 would behave as a substantially open circuit at the center frequency and provide the substantially short-circuited path at twice the center frequency. That is, the impedance provided by the first impedance matching circuit 130 at the center frequency should be higher enough, for example, equal to or greater than 250 ohms. And the impedance provided by the first impedance matching circuit 130 at twice the center frequency should be lower enough, for example, near to 0 ohm.

In addition, in FIG. 1, the first impedance matching circuit 130 can further include a resistor R1. The resistor R1 has a first terminal coupled to the inductor L1, and a second terminal coupled to the node N2. In this case, the capacitor C2 and the inductor L2 can be coupled in series between the node N1 and the first terminal of the resistor R1. With the resistor R1, the first impedance matching circuit 130 can adjust the impedance corresponding to the beat frequency of the RF signals, further suppressing the IM3 of the RF signals.

However, the first impedance matching circuit 130 is not limited to including the resistor R1. In some other embodiments of the present invention, the resistor R1 of the first impedance matching circuit 130 could be omitted if the practical condition permits.

In FIG. 1, the power amplifier device 100 can further include a second impedance matching circuit 170 and a third impedance matching circuit 180. The second impedance matching circuit 170 is coupled to the output terminal of the amplifier 110 and the capacitor C1, and can provide a substantial short-circuited path between the output terminal of the amplifier 110 and the common voltage terminal VT1 at the frequency twice the center frequency. The third impedance matching circuit 180 can be coupled to the output terminal of the amplifier 120, and can provide a substantial short-circuited path between the output terminal of the amplifier 120 and the common voltage terminal VT1 at the frequency twice the center frequency. That is, the second impedance matching circuit 170 and the third impedance matching circuit 180 can be a notch filter corresponding to the frequency twice the center frequency so as to provide the short-circuited paths corresponding to the frequency twice the center frequency at different points on the transmission path of the RF signals, ensuring the linearity of the amplifier device 100.

However, in some embodiments, if the capacitor C1 has greater capacitance, it is possible that the first impedance matching circuit 130 is enough to preserve the linearity required by the system. In this case, the second impedance circuit 170 of the power amplifier device 100 could be omitted.

In some embodiments, since the linearity loss may become more significant when the power amplifier device is operated under a high power mode, the switch element and the detection circuit may be used to control the first impedance circuit.

Figure 2:
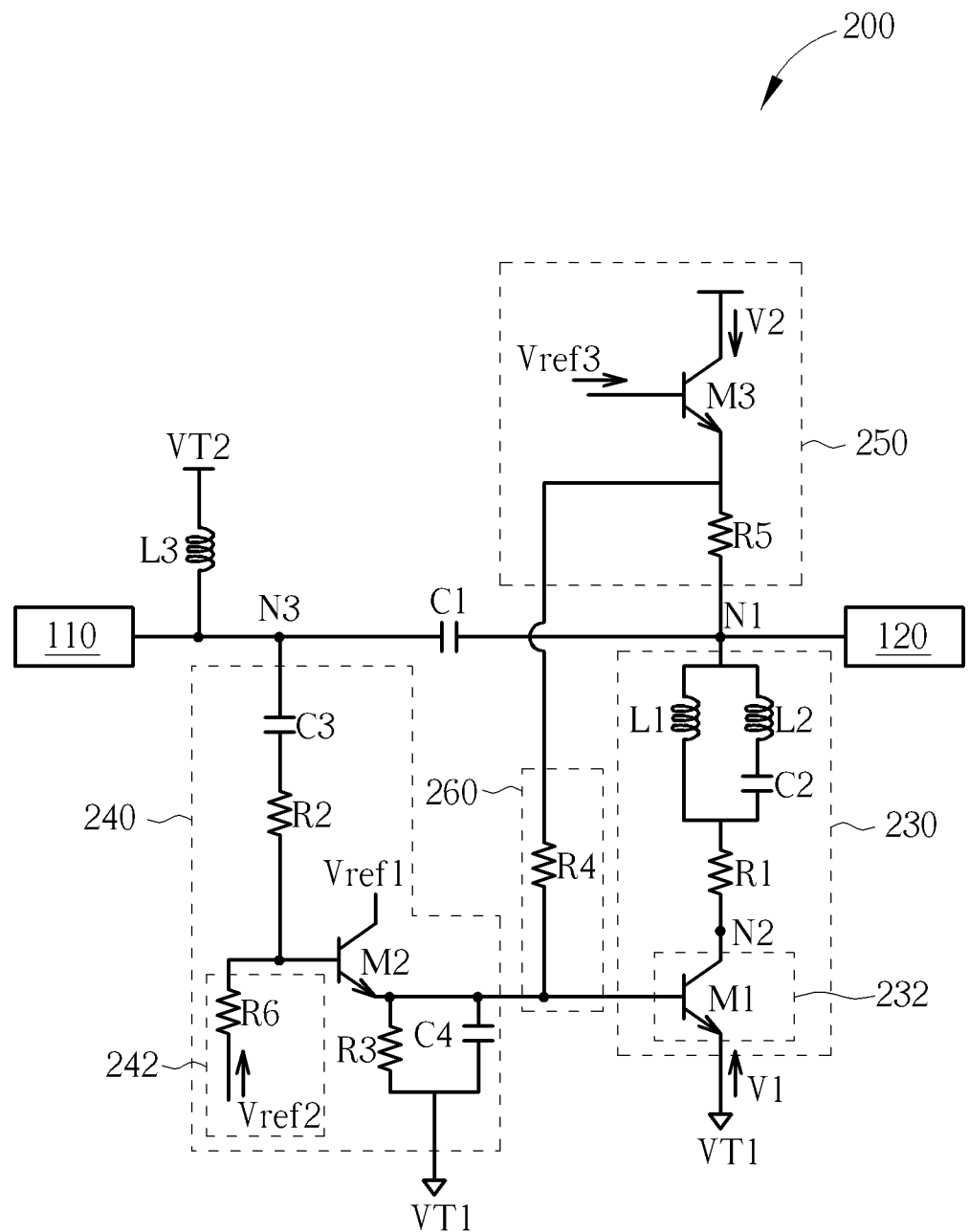
FIG. 2 shows an amplifier device according to another embodiment of the present invention.

FIG. 2 shows an amplifier device, such as a power amplifier device 200 according to one embodiment of the present invention. The power amplifier devices 100 and 200 have similar structures and can be operated by similar principles. However, the first impedance matching circuit 230 of the power amplifier device 200 can further include a switch element 232. The switch element 232 has a first terminal coupled to the node N2, and a second terminal coupled to the common voltage terminal VT1. The switch element 232 can enable a short-circuited path between the node N2 and the common voltage terminal VT1 selectively.

Furthermore, the power amplifier device 200 can further include the detection circuit 240. The detection circuit 240 is coupled to the switch element 232 and the node N3 on the transmission path of the RF signals. The detection circuit 240 can couple the RF signals transmitted from the amplifier 110 and detect the output power of the power amplifier device 200 at the node N3, and enable a short-circuited path between the node N2 and the common voltage terminal VT1 when the output power is higher than a predetermined value. That is, the power amplifier device 200 can turn on the switch element 232 of the first impedance matching circuit 230 only when the power amplifier device 200 is operated under the high power mode, that is, when the output power is higher than the predetermined value. At this time, the first impedance circuit 230 will provide the substantial short-circuited path between the node N1 and the common voltage terminal VT1 at the frequency twice the center frequency. Otherwise, when the power amplifier device 200 is not operated under the high power mode, that is, if the output power is not higher than the predetermined value, then the switch element 232 will not be turned on. At this time, the first impedance matching circuit 230 will behave as a substantial open circuit, preventing the overall impedance of the power amplifier device 200 under the low power mode from being changed unnecessarily.

In FIG. 2, the node N3 can be disposed between the output terminal of the amplifier 110 and the capacitor C1, and the detection circuit 240 can detect the power on the path between the output terminal of the amplifier 110 and the capacitor C1. However, when the power mode of the power amplifier device 200 changes, the intensities of the RF signals detected at any point on the transmission path will also be changed. Therefore, in some other embodiments, the node N3 can be disposed at other positions on the transmission path of the RF signals. That is, according to the system requirement, the detection circuit 240 may detect the power at other positions on the transmission path. For example, the node N3 can be disposed between the node N1 and the capacitor C1, or can be disposed between the node N1 and the input terminal of the amplifier 120. In addition, since the intensities of the RF signals detected at different positions on the transmission path may be different, the internal elements of the detection circuit 240 may be designed and adjusted according to the position of the node N3 for matching with the RF signal intensity to be detected.

In FIG. 2, the switch element 232 can include a transistor M1. The transistor M1 has a first terminal coupled to the node N2, a second terminal coupled to the common voltage terminal VT1, and a control terminal coupled to the detection circuit 240. In this case, the detection circuit 240 can enable the signal path between the first terminal and the second terminal of the transistor M1 when the output power is higher than the predetermined value.

Since the transistor M1 will have a turn-on resistance when being turned on, the designer may take the turn-on resistance of the transistor M1 into consideration when determining the resistance of the resistor R1 for providing the corresponding impedance at the beat frequency so the provided impedance can be more appropriate.

In addition, in some embodiments, the transistor M1 can be a diode connected transistor. In other words, the control terminal of transistor M1 can be coupled to the first terminal of the transistor M1. In this case, the detection circuit 240 will provide a corresponding bias voltage to turn on the diode connected transistor M1 when the output power is higher than the predetermined value. Or, the switch element 232 can include a diode to replace the transistor M1. For example, the first terminal (e.g., anode) of the diode can be coupled to the node N2, and the second terminal (e.g., cathode) of the diode can be coupled to the common voltage terminal VT1. In this case, the detection circuit 240 can provide the corresponding bias voltage to the first terminal of the diode to turn on the diode and enable the short-circuited path between the node N2 and the common voltage terminal VT1 when the output power is higher than the predetermined value.

In FIG. 2, the detection circuit 240 can include a transistor M2, a capacitor C3, and a resistor R2. The transistor M2 has a first terminal for receiving the reference voltage Vref1 for turning on the transistor M2, a second terminal coupled to the switch element 232, and a control terminal. The resistor R2 and the capacitor C3 are coupled in series between the node N3 and the control terminal of the transistor M2. In addition, the detection circuit 240 can further include the resistor R3 and the capacitor C4. The resistor R3 has a first terminal coupled to the second terminal of the transistor M2, and a second terminal coupled to the common voltage terminal VT1. The capacitor C4 has a first terminal coupled to the second terminal of the transistor M2, and a second terminal coupled to the common voltage terminal VT1.

In the present embodiment, the capacitor C3 and the resistor R2 can couple the high frequency RF signals at the node N3 to the detection circuit 240. The resistor R2 can increase the impedance and prevent the capacitor C3 from coupling the RF signals excessively and affecting the performance of the power amplifier 200 adversely. When the power amplifier device 200 is operated under the high power mode, a DC (direct current) bias voltage using for turning on the transistor M1 could be generated and rectified from the AC (alternating current) RF signals by the turned-on transistor M2, the resistor R3 and the capacitor C4. That is, by choosing the proper capacitor C3, resistor R3 and capacitor C4, when the power amplifier device 200 is operated under the high power mode, that is, when the output power is higher than the predetermined value, the AC RF signals could be rectified into a DC bias voltage for biasing and turning on the transistor M2, so as to turn on the transistor M1.

Furthermore, in FIG. 2, the detection circuit 240 can further include a first bias circuit 242. The first bias circuit 242 can include a resistor R6, and the first bias circuit 242 can provide a reference voltage Vref2 to the control terminal of the transistor M2 through the resistor R6, ensuring the transistor M2 to be turned on.

Since the first impedance matching circuit 230 will draw a current when the switch element 232 is turned on, to mitigate the influence of the intensity of the RF signals from being affected, the power amplifier device 200 can further include a second bias circuit 250 to output the supplied current, compensating the current drawn by the first impedance matching circuit 230. The second bias circuit 250 can be coupled between the input terminal of the amplifier 120 and the capacitor C1. In FIG. 2, the second bias circuit 250 can include a transistor M3. The transistor M3 has a first terminal for receiving a second system voltage V2, a second terminal coupled to the input terminal of the amplifier 120, and a control terminal for receiving a reference voltage Vref3. In some embodiments, the second system voltage V2 can be an operational voltage in the system, and can be higher than the first system voltage V1.

Furthermore, the power amplifier device 200 can further include a compensation circuit 260. The compensation circuit 260 can be coupled to the second bias circuit 250 and the detection circuit 240. When the detection circuit 240 detects that the output power is higher than the predetermined value, the detection circuit 240 would control the second bias circuit 250 through the compensation circuit 260 to increase the supplied current.

For example, the compensation circuit 260 can include a resistor R4, and the second bias circuit 250 can include a resistor R5. The resistor R4 has a first terminal coupled to the second bias circuit 250, and a second terminal coupled to the detection circuit 240. The resistor R5 has a first terminal coupled to the second terminal of the transistor M3, and a second terminal coupled to the input terminal of the amplifier 120.

In FIG. 2, the first terminal of the resistor R4 in the compensation circuit 260 can be coupled to the first terminal of the resistor R5. Therefore, when the detection circuit 240 turns on the switch element 232, the voltage drop on the resistor R5 will be changed, urging the transistor M3 to increase the supplied current. However, in some other embodiments, the first terminal of the resistor R4 can also be coupled to the second terminal of the resistor R5.

With the power amplifier device 200, the first impedance matching circuit 230 can suppress the second harmonic of the RF signals in the high power mode so as to suppress the IM3 of the RF signals and improve the linearity performance. Furthermore, since the bias circuit 250 and the compensation circuit 260 can provide the supplied current to compensate the current drawn by the first impedance matching circuit 230, the concerns of weakening the RF signals can be mitigated.

In FIG. 1 and FIG. 2, the power amplifier devices 100 and 200 can further include an inductor L3. The inductor L3 can be coupled between the output terminal of the amplifier 110 and the capacitor C1, and also be coupled to the common voltage terminal VT2 for providing the DC bias voltage at the output terminal of the amplifier 110 as required by the amplifier 110.

In one embodiment, the transistor above could be a bipolar junction transistor (BJT), and the first terminal is collector, the second terminal is emitter, and the control terminal is base. In another embodiment, the transistor above could be a field effect transistor (FET), and the first terminal is drain, the second terminal is source, and the control terminal is gate.

In summary, the power amplifier devices provided by the embodiments of the present invention can use the impedance matching circuit to reduce the second harmonic of the RF signals so as to suppress the third order intercept and intermodulation of the RF signals generated by the power amplifier device. Furthermore, since the power amplifier devices can further include a detection circuit, the switch element in the impedance matching circuit can be turned on when the power amplifier device is operated under the high power mode, mitigating the influence of the impedance of the power amplifier device from being altered under the low power mode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier device comprising:
    a first amplifier configured to amplify a radio frequency signal;
    a second amplifier configured to receive the radio frequency signal transmitted from the first amplifier, and amplify the radio frequency signal;
    a first capacitor coupled to an output terminal of the first amplifier and an input terminal of the second amplifier;
    a first node disposed between the input terminal of the second amplifier and the first capacitor, and
    a first impedance matching circuit coupled to the first node and a common voltage terminal, wherein the first impedance matching circuit behaves as a substantially open circuit at a center frequency of the radio frequency signal, and the impedance matching circuit provides a substantially short-circuited path from the first node to the common voltage terminal at a frequency twice the center frequency.

2. The amplifier device of claim 1, wherein the first impedance matching circuit comprises:
    a first inductor coupled between the first node and a second node;
    a second capacitor; and
    a second inductor coupled in series with the second capacitor, the second inductor and the second capacitor being coupled between the first node and the second node;
    wherein the first impedance matching circuit is coupled to the common voltage terminal through the second node, and the first inductor is coupled in parallel with the second capacitor and the second inductor coupled in series.

3. The amplifier device of claim 2, wherein the first impedance matching circuit further comprises:
    a first resistor having a first terminal coupled to the first inductor, and a second terminal coupled to the second node;
    wherein the second capacitor and the second inductor are coupled in series between the first node and the first terminal of the first resistor.

4. The amplifier device of claim 2, wherein the first impedance matching circuit comprises:
    a switch element having a first terminal coupled to the second node, and a second terminal coupled to the common voltage terminal, and the switch element being configured to enable a short-circuited path between the second node and the common voltage terminal selectively.

5. The amplifier device of claim 4, further comprising a detection circuit, coupled to the switch element and a third node on a transmission path of the radio frequency signal, and configured to detect an output power of the amplifier device at the third node, and enable the short-circuited path between the second node and the common voltage terminal when the output power is higher than a predetermined value.

6. The amplifier device of claim 5, wherein the third node is disposed between the output terminal of the first amplifier and the first capacitor, between the first node and the first capacitor, or between the first node and the input terminal of the second amplifier.

7. The amplifier device of claim 5, wherein the switch element comprises:
    a diode having a first terminal coupled to the second node, and a second terminal coupled to the common voltage terminal.

8. The amplifier device of claim 5, wherein the switch element comprises:
    a first transistor having a first terminal coupled to the second node, a second terminal coupled to the common voltage terminal, and a control terminal coupled to the detection circuit.

9. The amplifier device of claim 8, wherein the detection circuit enables a signal path between the first terminal and the second terminal of the first transistor when the output power is greater than the predetermined value.

10. The amplifier device of claim 5, wherein the detection circuit comprises:
    a second transistor having a first terminal configured to receive a first reference voltage, a second terminal coupled to the switch element, and a control terminal;
    a third capacitor; and
    a second resistor coupled in series with the third capacitor between the third node and the control terminal of the second transistor.

11. The amplifier device of claim 10, wherein the detection circuit further comprises:
    a third resistor having a first terminal coupled to the second terminal of the second transistor, and a second terminal coupled to the common voltage terminal; and
    a fourth capacitor having a first terminal coupled to the second terminal of the second transistor, and a second terminal coupled to the common voltage terminal.

12. The amplifier device of claim 10, wherein the detection circuit further comprises:
    a first bias circuit comprising a sixth resistor, and the first bias circuit being configured to provide a second reference voltage to the control terminal of the second transistor through the sixth resistor.

13. The amplifier device of claim 5, further comprising:
    a second bias circuit coupled between the input terminal of the second amplifier and the first capacitor, and configured to output a supplied current.

14. The amplifier device of claim 13, wherein the second bias circuit comprises:
    a third transistor having a first terminal configured to receive a second system voltage, a second terminal coupled to the input terminal of the second amplifier, and a control terminal configured to receive a third reference voltage.

15. The amplifier device of claim 13, further comprising:
    a compensation circuit coupled to the second bias circuit and the detection circuit;
    wherein when the detection circuit detects that the output power is higher than the predetermined value, the detection circuit controls the second bias circuit through the compensation circuit to increase the supplied current.

16. The amplifier device of claim 15, wherein the compensation circuit comprises:
    a fourth resistor having a first terminal coupled to the second bias circuit, and a second terminal coupled to the detection circuit.

17. The amplifier device of claim 16, wherein:
    the second bias circuit further comprises a fifth resistor having a first terminal coupled to the second terminal of the third transistor, and a second terminal coupled to the input terminal of the second amplifier; and
    the first terminal of the fourth resistor in the compensation circuit is coupled to the first terminal of the fifth resistor or the second terminal of the fifth resistor.

18. The amplifier device of claim 1, further comprising:
a third inductor coupled to the output terminal of the first amplifier and the first capacitor, and configured to provide a direct current (DC) voltage.

19. The amplifier device of claim 1, further comprising a second impedance matching circuit coupled to the output terminal of the first amplifier and the first capacitor, and configured to provide a substantially short-circuited path between the output terminal of the first amplifier and the common voltage terminal at a frequency twice the center frequency.

20. The amplifier device of claim 1, further comprising a third impedance matching circuit coupled to the output terminal of the second amplifier, and configured to provide a substantially short-circuited path between the output terminal of the second amplifier and the common voltage terminal at a frequency twice the center frequency.

* * * * *